(12) United States Patent
Luo (10) Patent No.: US 10,978,527 B2
(45) Date of Patent: Apr. 13, 2021

(54) DISPLAY SUBSTRATE AND METHOD OF FABRICATING THE SAME, AND DISPLAY DEVICE

(71) Applicant: BOE TECHNOLOGY GROUP CO., LTD., Beijing (CN)

(72) Inventor: Chengyuan Luo, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/609,930

(22) PCT Filed: Mar. 29, 2019

(86) PCT No.: PCT/CN2019/080391
§ 371 (c)(1),
(2) Date: Oct. 31, 2019

(87) PCT Pub. No.: WO2019/196679
PCT Pub. Date: Oct. 17, 2019

(65) Prior Publication Data
US 2020/0203446 A1    Jun. 25, 2020

(30) Foreign Application Priority Data
Apr. 10, 2018 (CN) .......................... 201810317122.1

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3276* (2013.01); *H01L 51/5228* (2013.01); *H01L 51/56* (2013.01); *H01L 2251/5315* (2013.01)

(58) Field of Classification Search
CPC ............ H01L 27/3246; H01L 27/3276; H01L 51/5228; H01L 51/56
See application file for complete search history.

(56) References Cited

U.S. PATENT DOCUMENTS 9,087,763 B2    7/2015 Jiang
2014/0353597 A1    12/2014 Ahn
(Continued)

FOREIGN PATENT DOCUMENTS

CN    102705790 A    10/2012
CN    103545345 A    1/2014
(Continued)

OTHER PUBLICATIONS

First Office Action dated Jul. 24, 2020 for application No. CN201810317122.1 with English translation attached.

*Primary Examiner* — Marc Anthony Armand
(74) *Attorney, Agent, or Firm* — Nath, Goldberg & Meyer; Joshua B. Goldberg (57) ABSTRACT

A display substrate includes a base substrate provided thereon with a pixel defining layer and a plurality of organic light emitting diodes, a plurality of conductive structures are provided on a side of a top electrode layer away from the base substrate, the top electrode layer being on the pixel defining layer, an orthographic projection of the conductive structures on a plane where the pixel defining layer is within an area where the pixel defining layer is disposed, the conductive structures are coupled to a portion of the top electrode layer on the pixel defining layer, the remaining portion of the top electrode layer is provided with a planarization layer on a side of the top electrode layer away from the base substrate, and an auxiliary electrode is on a side of the planarization layer away from the base substrate, and is coupled to the conductive structures.

20 Claims, 4 Drawing Sheets

(56) References Cited

U.S. PATENT DOCUMENTS

2017/0047386 A1* 2/2017 Lee .................... G01R 31/3177
2017/0125495 A1* 5/2017 Lee .................... H01L 51/5212
2019/0088728 A1 3/2019 Wu et al.

FOREIGN PATENT DOCUMENTS

| CN | 105895664 A | 8/2016 |
| CN | 107342372 A | 11/2017 |
| CN | 107394052 A | 11/2017 |
| CN | 107482044 A | 12/2017 |
| CN | 107611280 A | 1/2018 |
| CN | 108417609 A | 8/2018 |

* cited by examiner

DISPLAY SUBSTRATE AND METHOD OF FABRICATING THE SAME, AND DISPLAY DEVICE

CROSS-REFERENCE TO RELATED APPLICATION

This is a National Phase Application filed under 35 U.S.C. 371 as a national stage of PCT/CN2019/080391, filed Mar. 29, 2019, an application claiming priority to Chinese Patent Application no. 201810317122.1, filed on Apr. 10, 2018, the contents of each of which are incorporated herein by reference in the entirety.

TECHNICAL FIELD

The present disclosure relates to the field of display technology, and particularly to a display substrate and a method of fabricating the same, and a display device.

BACKGROUND

Organic Light-Emitting Diode (OLED) panels are a display illumination technology developed gradually in recent years, and are regarded as having a wide application prospect, especially in the display industry, due to their advantages of fast response, high contrast, flexibility, etc. Among them, the top-emission type OLED structure has advantages of higher aperture ratio, light extraction optimization with the use of microcavity effect, and the like, and thus becomes a main direction of research.

SUMMARY

The present disclosure provides a display substrate including a base substrate provided thereon with a pixel defining layer and a plurality of sub-pixel regions defined by the pixel defining layer, the plurality of sub-pixel regions having a plurality of organic light emitting diodes provided therein, the plurality of organic light emitting diodes sharing one top electrode layer which is on the pixel defining layer and light emitting layers of the plurality of organic light emitting diodes. At least a portion of the top electrode layer on the pixel defining layer is provided with a plurality of conductive structures on a side of the top electrode layer away from the base substrate, an orthographic projection of the plurality of conductive structures on a plane where the pixel defining layer is located is within an area where the pixel defining layer is disposed, the plurality of conductive structures are coupled to the portion of the top electrode layer on the pixel defining layer, the remaining portion of the top electrode layer is provided with a planarization layer on a side of the top electrode layer away from the base substrate, and an auxiliary electrode is on a side of the planarization layer away from the base substrate, and is coupled to the plurality of conductive structures so as to be electrically connected with the top electrode layer in parallel.

In an embodiment, the plurality of sub-pixel regions are arranged in a plurality of rows and a plurality of columns, the organic light emitting diodes of every four adjacent sub-pixel regions in a row direction or a column direction constitute a pixel unit, and four conductive structures are arranged at opposite corners of the pixel unit.

In an embodiment, the plurality of sub-pixel regions are arranged in a plurality of rows and a plurality of columns, the organic light emitting diodes of four sub-pixel regions of every two adjacent rows and two adjacent columns constitute a pixel unit, and four conductive structures are arranged at opposite corners of the pixel unit.

In an embodiment, the conductive structures have a thickness of about 1 µm to 2 µm.

In an embodiment, the display substrate further includes an adhesive layer between the planarization layer and the auxiliary electrode.

In an embodiment, a surface of the adhesive layer on a side of the adhesive layer away from the base substrate is coplanar with surfaces of the plurality of conductive structures on a side of the plurality of conductive structures away from the base substrate.

In an embodiment, the auxiliary electrode is a mesh-shaped auxiliary electrode made of a metal material, the mesh-shaped auxiliary electrode extends along the pixel defining layer, and an orthographic projection of the mesh-shaped auxiliary electrode on the plane where the pixel defining layer is located is within the area where the pixel defining layer is disposed; or, the auxiliary electrode is a plate-shaped electrode which is made of a transparent conductive material and laid in a whole layer.

In an embodiment, the display substrate further includes a film encapsulation layer on a side of the auxiliary electrode away from the base substrate.

The present disclosure further provides a display device including the display substrate described above.

The present disclosure further provides a method of fabricating a display substrate, including:

forming, on a base substrate, a pixel defining layer and a plurality of sub-pixel regions defined by the pixel defining layer, and forming bottom electrodes and light emitting layers of a plurality of organic light emitting diodes in the plurality of sub-pixel regions;

providing a top electrode layer on the pixel defining layer and the light emitting layers of the plurality of organic light emitting diodes;

forming a plurality of conductive structures on at least a portion of the top electrode layer on the pixel defining layer at a side of the top electrode layer away from the base substrate, an orthographic projection of the plurality of conductive structures on a plane where the pixel defining layer being within an area where the pixel defining layer is disposed, and the plurality of conductive structures being coupled to the portion of the top electrode layer on the pixel defining layer;

forming a planarization layer on the remaining portion of the top electrode layer at a side of the top electrode layer away from the base substrate; and forming an auxiliary electrode on a side of the planarization layer away from the base substrate, the auxiliary electrode being coupled to the plurality of conductive structures so as to be electrically connected with the top electrode layer in parallel.

In an embodiment, the step of forming an auxiliary electrode on a side of the planarization layer away from the base substrate includes:

forming the auxiliary electrode through a sputtering process; and transferring, through a transfer process, the auxiliary electrode to the side of the planarization layer away from the base substrate.

In an embodiment, the method further includes:

forming an adhesive layer between the planarization layer and the auxiliary electrode.

In an embodiment, the step of forming an adhesive layer between the planarization layer and the auxiliary electrode includes:

after forming the planarization layer, forming, through a printing process, a curable adhesive material on a side of the planarization layer away from the base substrate; and after forming the auxiliary electrode, curing the adhesive material to form the adhesive layer.

In an embodiment, the step of forming a plurality of conductive structures on at least a portion of the top electrode layer on the pixel defining layer at a side of the top electrode layer away from the base substrate, includes:

forming the plurality of conductive structures by a mask evaporation or mold hot pressing method.

In an embodiment, the plurality of sub-pixel regions are arranged in a plurality of rows and a plurality of columns, the organic light emitting diodes of every four adjacent sub-pixel regions in a row direction or a column direction constitute a pixel unit, and four conductive structures are arranged at opposite corners of the pixel unit.

In an embodiment, the plurality of sub-pixel regions are arranged in a plurality of rows and a plurality of columns, the organic light emitting diodes of four sub-pixel regions of every two adjacent rows and two adjacent columns constitute a pixel unit, and four conductive structures are arranged at opposite corners of the pixel unit.

In an embodiment, the conductive structures have a thickness of about 1 µm to 2 µm.

In an embodiment, the step of forming a planarization layer on the remaining portion of the top electrode layer at a side of the top electrode layer away from the base substrate, includes:

forming the planarization layer through a printing process.

In an embodiment, in the step of forming an auxiliary electrode on a side of the planarization layer away from the base substrate, the auxiliary electrode is formed to be a mesh-shaped auxiliary electrode made of a metal material, the mesh-shaped auxiliary electrode extends along the pixel defining layer, and an orthographic projection of the mesh-shaped auxiliary electrode on the plane where the pixel defining layer is located is within the area where the pixel defining layer is disposed; or, the auxiliary electrode is a plate-shaped electrode which is made of a transparent conductive material and laid in a whole layer.

In an embodiment, the method further includes:

forming a film encapsulation layer on a side of the auxiliary electrode away from the base substrate.

DETAILED DESCRIPTION

To make those skilled in the art better understand the technical solutions of the present disclosure, a display substrate, a method of fabricating the same and a display device according to the present disclosure are described in detail below with reference to the accompanying drawings. The display substrate is specifically an OLED display substrate.

For the top-emission type OLED structure, a top electrode (a cathode of the OLED) which serves as a light-emitting surface of the OLED must have good light transmittance. Currently, the top electrode of the top-emission type OLED structure is mostly made of thin metal or transparent conductive material (e.g., ITO, IZO). The metal material has a poor transmittance, and when thinned to be used as a large area electrode, the metal material is prone to have an increased resistance, which is not beneficial to the development of large-sized devices; transparent conductive materials such as ITO and IZO have lower conductivity than metals when they are made at low temperatures.

In the existing art, metal is used as an auxiliary electrode of ITO or IZO, and is fabricated on a non-light-emission area of the back plate by photolithography to improve the overall conductivity of the top electrode and reduce the resistance. However, the photolithography technique requires a complex process, involves multiple mask plates and exposure processes, and damages the light emitting layer of the OLED device due to the process characteristics of high temperature, photoresist washing and the like, and is not suitable for mass production. As another way to improve the conductivity of the top electrode, an auxiliary electrode is fabricated on the package cover plate. In this case, the above-mentioned problems in the fabrication process can be avoided, but the auxiliary electrode is supported by the package cover plate, which may increase the thickness of the finally-formed OLED display device, and is not beneficial to the lightening and thinning of the OLED display device.

Figure 1:
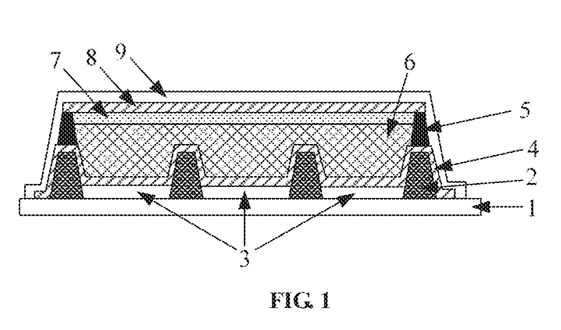
FIG. 1 is a schematic cross-sectional view of a display substrate according to an embodiment of the present disclosure.

FIG. 1 is a schematic cross-sectional view of a display substrate according to an embodiment of the disclosure. As shown in FIG. 1, the display substrate includes: a base substrate 1, a pixel defining layer (PDL) 2 on the base substrate 1, and a plurality of sub-pixel regions defined by the pixel definition layer, and a plurality of organic light emitting diodes are respectively arranged in the plurality of sub-pixel regions. The plurality of organic light emitting diodes share a top electrode layer 4. The top electrode layer 4 is disposed over the pixel defining layer 2 and the light emitting layers 3 of the plurality of organic light emitting diodes. The sub-pixel regions are arranged in a plurality of rows and a plurality of columns. The organic light emitting diodes of every four adjacent sub-pixel regions in the row direction or the column direction constitute a pixel unit; alternatively, the organic light emitting diodes of four sub-pixel regions of every two adjacent rows and two adjacent columns constitute a pixel unit. The organic light emitting diodes are positioned in the sub-pixel regions. The organic light emitting diode generally includes a bottom electrode (anode, not shown), a light emitting layer 3, and a top electrode (cathode) 4. All the organic light emitting diodes share one top electrode 4, and the top electrode 4 can have a structure of being laid in a whole layer. Needless to say, in order to improve the light emitting efficiency of the light emitting layer 3, other functional film layers, such as an electron/hole transport layer (not shown), an electron/hole barrier layer (not shown), may be further provided between the light emitting layer 3 and the bottom electrode/the top electrode 4.

In the present disclosure, the top electrode layer 4 on the pixel defining layer is provided with a plurality of conductive structures 5 on a side of the top electrode layer 4 away from the base substrate 1, an orthographic projection of the plurality of conductive structures 5 on a plane where the pixel defining layer 2 is located is within an area where the pixel defining layer 2 is disposed, and the plurality of conductive structures 5 are coupled to the portion of the top electrode layer 4 on the pixel defining layer 2. In an embodiment, four conductive structures are disposed at opposite corners of each pixel unit. A planarization layer 6 is on a side of the top electrode layer 4 away from the base substrate 1. An auxiliary electrode 8 is on a side of the planarization layer 6 away from the base substrate 1. In a case where the auxiliary electrode 8 is a metal mesh, the auxiliary electrode is laid in a whole layer along the pixel defining layer. In a case where the auxiliary electrode 8 is made of transparent conductive material, the auxiliary electrode 8 is a plate-shaped electrode laid in a whole layer. The auxiliary electrode 8 is coupled to the conductive structures 5 so as to be electrically connected with the top electrode layer 4 in parallel.

It should be noted that, the shape of the conductive structure 5 may be a pillar shape, a mesa shape, or the like, and the shape of the conductive structure is not limited in the technical solution of the present disclosure. The auxiliary electrode 8 may be made of a metal material or a transparent conductive material. In a case where the auxiliary electrode 8 is made of a metal material, the auxiliary electrode 8 is a mesh electrode laid along the pixel defining layer, an orthographic projection thereof on the plane where the pixel defining layer 2 is located is within an area where the pixel defining layer 2 is disposed, and the auxiliary electrode 8 is formed to be a mesh electrode laid in a whole layer, and at this time, the resistance is minimum. In a case where the auxiliary electrode 8 is made of a transparent conductive material, the auxiliary electrode 8 may be a plate-shaped electrode laid in a whole layer, and at this time, the resistance is minimum.

In the present disclosure, the auxiliary electrode 8 is formed without depending on the package cover plate, thereby effectively avoiding an increase in the thickness of the OLED display device and facilitating the lightening and thinning of the OLED display device. In addition, in order to prevent the photolithography process from damaging the OLED device that has already been fabricated, a transfer process may be used to form the auxiliary electrode 8 in the present disclosure. In this case, the planarization layer 6 is filled in the sub-pixel region, so that the auxiliary electrode 8 is prevented from being damaged during the transfer process.

In an embodiment, an adhesive layer 7 is disposed between the planarization layer 6 and the auxiliary electrode 8, and the adhesive layer 7 can make the fixation between the planarization layer 6 and the auxiliary electrode 8 firmer.

Further, a surface of the adhesive layer 7 on a side of the adhesive layer 7 away from the base substrate 1 is coplanar with surfaces of the conductive structures 5 on a side of the conductive structures 5 away from the base substrate 1, so that the subsequent process of forming the auxiliary electrode 8 through a transfer process can be smoothly performed.

In an embodiment, the display substrate further includes a film encapsulation layer 9 on a side of the auxiliary electrode 8 away from the base substrate 1. In the present disclosure, the film encapsulation layer 9 may fix the structure thereunder to prevent the auxiliary electrode 8 from falling off.

The embodiment(s) of the present disclosure provides a display substrate in which an auxiliary electrode is formed without depending on a packaging cover plate, thereby effectively avoiding an increase in the thickness of an OLED display device and facilitating the lightening and thinning of the OLED display device. In addition, in order to prevent the photolithography process from damaging the OLED device that has already been fabricated, a transfer process may be used to form the auxiliary electrode in the present disclosure. In this case, the planarization layer is filled in the sub-pixel region, so that the auxiliary electrode is prevented from being damaged during the transfer process.

Figure 2:
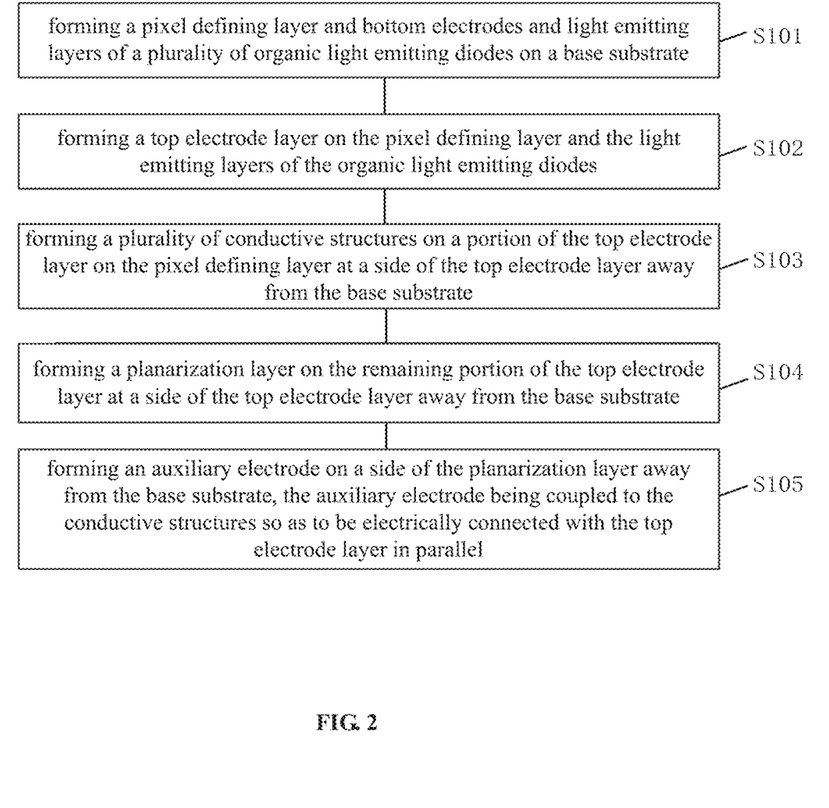
FIG. 2 is a flowchart of a method of fabricating a display substrate according to an embodiment of the present disclosure.

FIG. 2 is a flowchart of a method of fabricating a display substrate according to an embodiment of the disclosure. As shown in FIG. 2, the method, which can be used to fabricate the display substrate according to the above embodiment, includes steps S101 to S105.

Step S101 includes forming a pixel defining layer and bottom electrodes and light emitting layers of a plurality of organic light emitting diodes on a base substrate.

Step S102 includes forming a top electrode layer on the pixel defining layer and the light emitting layers of the organic light emitting diodes.

Step S103 includes forming a plurality of conductive structures on a portion of the top electrode layer on the pixel defining layer at a side of the top electrode layer away from the base substrate, an orthographic projection of the plurality of conductive structures on a plane where the pixel defining layer is located being within an area where the pixel defining layer is disposed, and the plurality of conductive structures being coupled to the portion of the top electrode layer on the pixel defining layer.

Step S104 includes forming a planarization layer on the remaining portion of the top electrode layer at a side of the top electrode layer away from the base substrate.

Step S105 includes forming an auxiliary electrode on a side of the planarization layer away from the base substrate, the auxiliary electrode being coupled to the conductive structures so as to be electrically connected with the top electrode layer in parallel.

In the present disclosure, the auxiliary electrode is formed without depending on the package cover plate, thereby effectively avoiding an increase in the thickness of the OLED display device and facilitating the lightening and thinning of the OLED display device.

Figure 3:
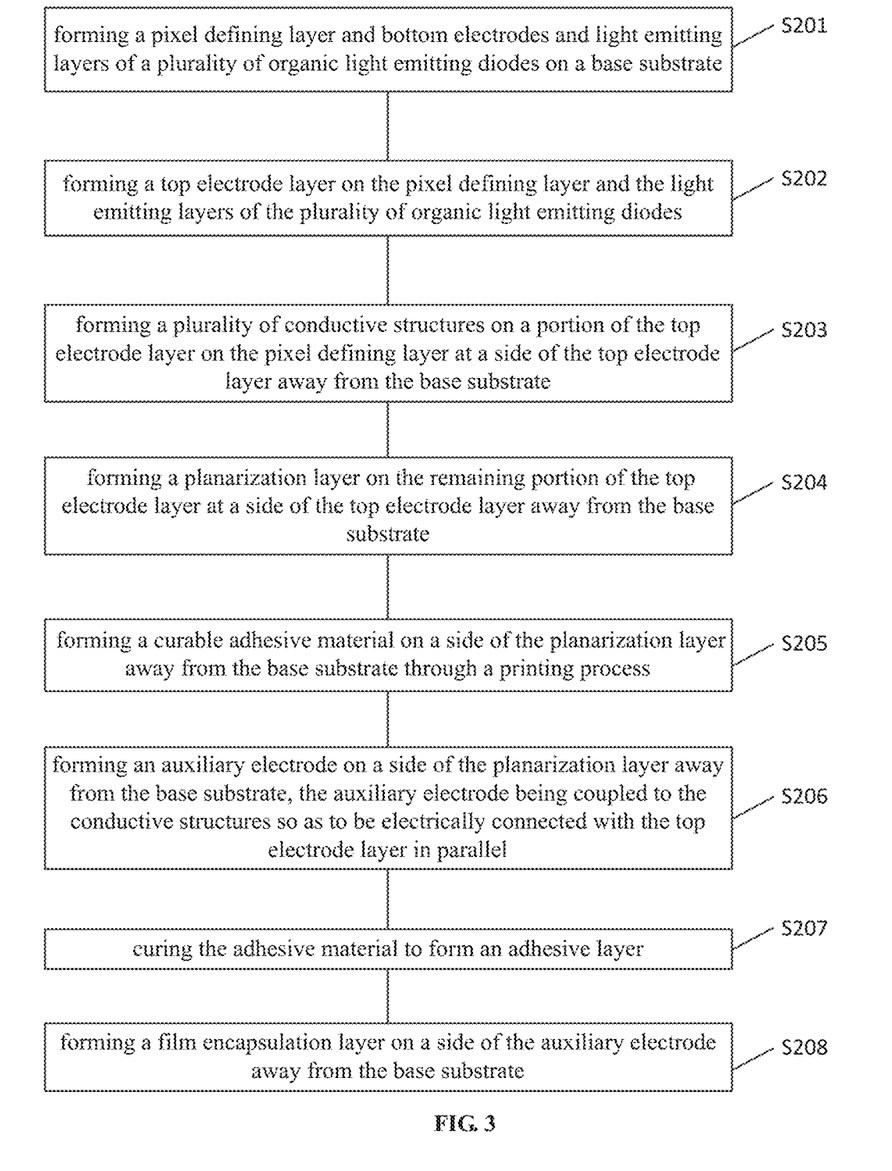
FIG. 3 is a flowchart of a method of fabricating a display substrate according to an embodiment of the present disclosure.
Figure 4A:
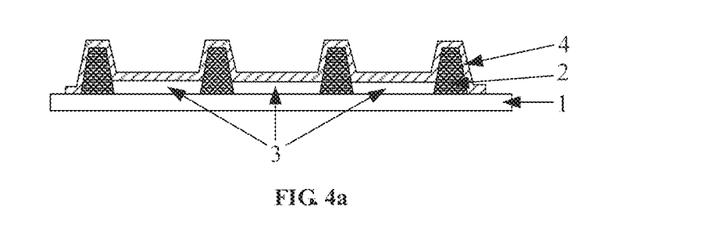
FIGS. 4*a* to 4*f* are schematic cross-sectional views of intermediate structures of the display substrate fabricated by the method shown in FIG. 3.
Figure 4B:
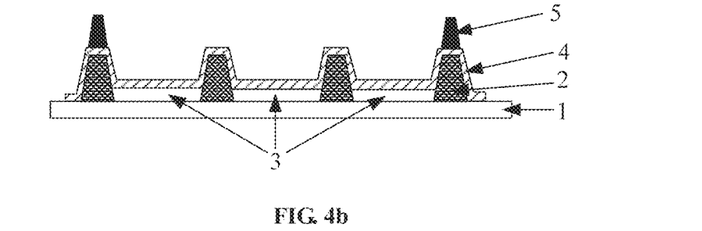
Figure 4C:
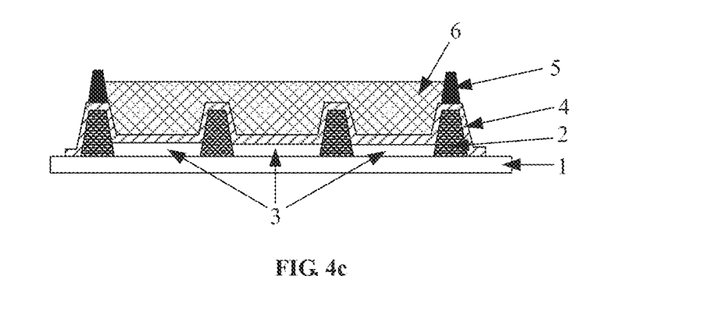
Figure 4D:
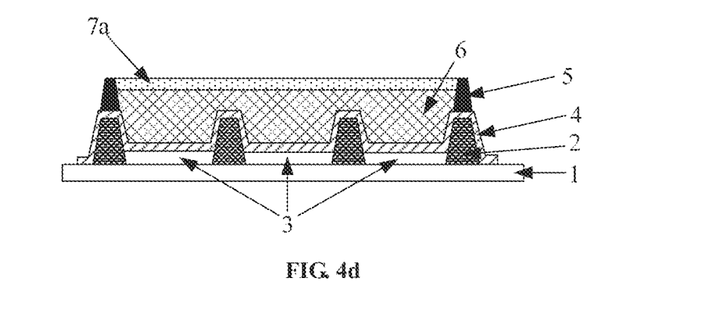
Figure 4E:
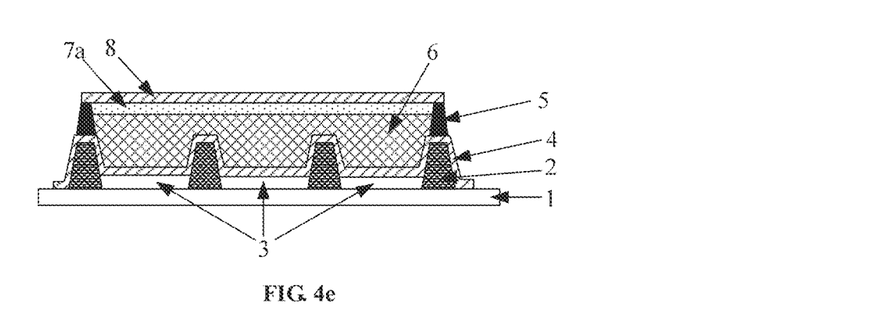
Figure 4F:
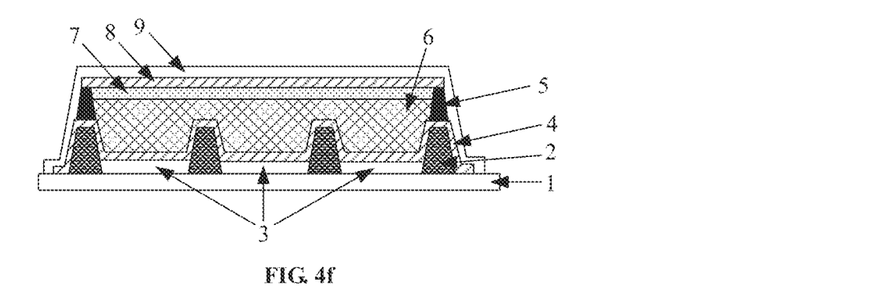

FIG. 3 is a flowchart of a method of fabricating a display substrate according to an embodiment of the disclosure, and FIGS. 4*a* to 4*f* are schematic cross-sectional views of intermediate structures of the display substrate fabricated by the method shown in FIG. 3. As shown in FIGS. 3 to 4*f*, the fabricating method is a more specific implementation based on the fabricating method according to the above embodiment, and includes steps S201 to S208.

Step S201 includes forming a pixel defining layer and bottom electrodes and light emitting layers of a plurality of organic light emitting diodes on a base substrate.

Referring to FIG. 4*a*, the process of forming the pixel defining layer 2 and the OLEDs on the base substrate 1 in step S201 may adopt a conventional process, the details of which will not be described herein. The OLED includes a bottom electrode (not shown) and a light emitting layer 3.

Step S202 includes forming a top electrode layer on the pixel defining layer and the light emitting layers of the plurality of organic light emitting diodes. Referring to FIG. 4*a*, the process of forming the top electrode layer 4 on the pixel defining layer and the organic light emitting diode in step S202 may adopt a conventional process, the details of which will not be described herein.

Figure 5:
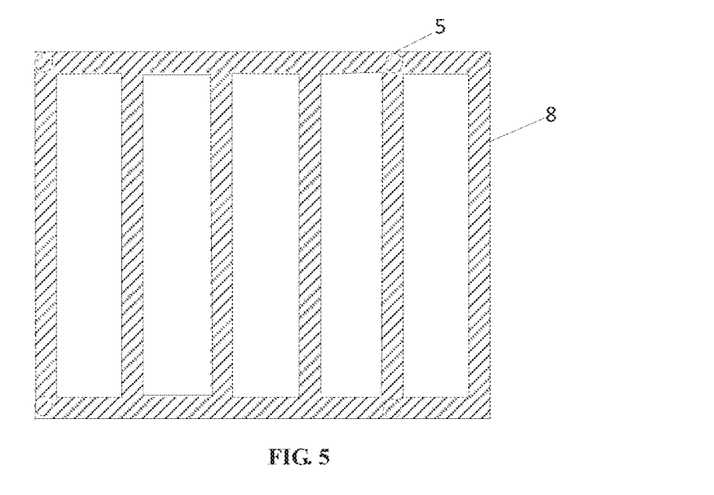
FIG. 5 is a plan view of the display substrate shown in FIG. 4*e* having an auxiliary electrode of a metal mesh.

Step S203 includes forming a plurality of conductive structures on a side of the top electrode layer, which is on the pixel defining layer, away from the base substrate, an orthographic projection of the plurality of conductive structures on a plane where the pixel defining layer is located being within an area where the pixel defining layer is disposed, and the plurality of conductive structures being coupled to the portion of the top electrode layer on the pixel defining layer. In an embodiment, as shown in FIG. 5, the organic light emitting diodes in every four adjacent sub-pixel regions in the row direction constitute one pixel unit, and four conductive structures are disposed at four vertices of the pixel unit, and in this case, the resistance is minimum. In an embodiment, the organic light emitting diodes in every four adjacent sub-pixel regions in the column direction constitute one pixel unit, and four conductive structures are disposed at four vertices of the pixel unit. In an embodiment, the organic light emitting diodes of four sub-pixel regions in two adjacent rows and two adjacent columns constitute one pixel unit, and four conductive structures are arranged at opposite corners of the pixel unit.

Referring to FIG. 4b, in step S203, the conductive structures 5 are made of at least one of Mg, Ag, Al, Mo, and Nd. The conductive structures 5 may be formed on the top electrode layer 4 by mask evaporation, mold hot pressing, or the like and corresponds to the region where the pixel defining layer 2 is disposed, and have a thickness of 1 μm to 2 μm. In the present disclosure, since the conductive structures 5 are fabricated without using a photolithography process, there is no damage to the OLED that has already been formed.

Step S204 includes forming a planarization layer on the remaining portion of the top electrode layer at a side of the top electrode layer away from the base substrate.

Referring to FIG. 4c, in step S204, the planarization layer 6 may be made of an inorganic-organic nanocomposite, the inorganic material may be quantum dots, nano wires, nano rods or the like with the radius of 1 nm to 10 nm, and the organic material may be a polymer such as polyacrylate, polymethyl methacrylate (PMMA), polycarbonate, or the like. The inorganic material and the organic material are dispersed in a solution of methanol, ethanol or the like to form a suspension of 10 weight percent (wt %) to 30 wt %, and then, the suspension is formed in the sub-pixel regions through a printing process, and is finally dried to fill the inner space of the pixel.

Step S205 includes forming a curable adhesive material on a side of the planarization layer away from the base substrate through a printing process.

Referring to FIG. 4d, the adhesive material 7a is a material curable under ultraviolet irradiation, and includes a monomer organic substance main body (with a volume ratio greater than 95%) and an additive, where the additive may be at least one of polyethylene, polystyrene, polypropylene, polyacrylic acid, polyacrylate, polyamide, polyimide, polycarbonate, urethane acrylate, polyester, polysiloxane, and polysilazane.

In an embodiment, an upper surface of the adhesive material 7a formed in step S205 is coplanar with upper surfaces of the conductive structures 5, which is beneficial to the subsequent transfer process for the auxiliary electrode.

Step S206 includes forming an auxiliary electrode on a side of the planarization layer away from the base substrate, the auxiliary electrode being coupled to the plurality of conductive structures so as to be electrically connected with the top electrode layer in parallel.

Referring to FIG. 4e, in step S206, an auxiliary electrode film having a thickness of 100 nm to 300 nm is first formed on a transfer demolding apparatus by a sputtering process. In a case where the auxiliary electrode 8 is made of an opaque metal material, the film of the auxiliary electrode 8 is a mesh film. In a case where the auxiliary electrode 8 is made of a transparent conductive material, the film of the auxiliary electrode 8 is a plate-shaped film laid in a whole layer. Then, the auxiliary electrode 8 is transferred to the side of the planarization layer 6 away from the base substrate 1 through a transfer process, a portion of the auxiliary electrode 8 is in contact with the conductive structures 5, and the other portion of the auxiliary electrode 8 is in contact with the adhesive material 7a. When adopting the metal mesh auxiliary electrode, the metal mesh is disposed along the arrangement of the pixel defining layer, as shown in FIG. 5.

Step S207 includes curing the adhesive material to form an adhesive layer.

In step S207, the adhesive material 7a is irradiated with ultraviolet light, such that the adhesive material 7a is cured to form the adhesive layer 7.

Step S208 includes forming a film encapsulation layer on a side of the auxiliary electrode away from the base substrate.

Referring to FIG. 4f, in step S208, the film encapsulation layer 9 includes at least one layer of inorganic or organic encapsulation film. The inorganic encapsulation film may be made of at least one of $SiN_x$, $SiO_2$, SiC, $Al_2O_3$, ZnS and ZnO (materials capable of blocking water and oxygen), and may be formed to a film having a thickness of 0.05 μm to 2.5 μm by using a process such as chemical vapor deposition (CVD), sputtering, atomic layer deposition (ALD) or the like. The organic encapsulation film may be made of at least one of polyethylene, polystyrene, polypropylene, polyacrylic acid, polyacrylate, polyamide, polyimide, polycarbonate, polyurethane acrylate, polyester, polysiloxane and polysilazane, and may be formed to a film having a thickness of 0.5 μm to 20 μm by spraying, printing or the like.

As can be seen from the above, in this embodiment, the conductive structures 5, the planarization layer 6, the adhesive layer 7, the auxiliary electrode 8, and the film encapsulation layer 9 are formed without using a photolithography process, so that there is no damage to the OLED that has already been formed, and the yield is effectively ensured.

An embodiment of the present disclosure provides a display device including a display substrate, where the display substrate is the display substrate according to the above embodiment and may be fabricated by the method according to the above embodiment(s). Detailed descriptions thereof may refer to the foregoing embodiments, and will not be described herein.

It is to be understood that the above embodiments are merely exemplary embodiments employed to explain the principles of the present disclosure, and the present disclosure is not limited thereto. Those of ordinary skill in the art may make various variations and improvements without departing from the spirit and essence of the present invention, and these variations and improvements shall also fall into the protection scope of the present disclosure.

What is claimed is:

1. A display substrate, comprising:
  a base substrate;
  a pixel defining layer on the base substrate and defining a plurality of sub-pixel regions;
  a plurality of organic light emitting diodes in the plurality of sub-pixel regions, respectively, the plurality of organic light emitting diodes sharing one top electrode layer which is on the pixel defining layer and light emitting layers of the plurality of organic light emitting diodes;

wherein a plurality of conductive structures on at least a portion of the top electrode layer on the pixel defining layer and at a side of the top electrode layer away from the base substrate, an orthographic projection of the plurality of conductive structures on a plane where the pixel defining layer is located being within an area where the pixel defining layer is disposed, and the plurality of conductive structures being coupled to the portion of the top electrode layer on the pixel defining layer;

a planarization layer on the remaining portion of the top electrode layer and at a side of the top electrode layer away from the base substrate; and an auxiliary electrode on a side of the planarization layer away from the base substrate and coupled to the plurality of conductive structures.

2. The display substrate of claim 1, wherein the plurality of sub-pixel regions are arranged in a plurality of rows and a plurality of columns, the organic light emitting diodes of every four adjacent sub-pixel regions in a row direction or a column direction constitute a pixel unit, and ones of the conductive structures are arranged at at least two corners of the pixel unit.

3. The display substrate of claim 1, wherein the plurality of sub-pixel regions are arranged in a plurality of rows and a plurality of columns, the organic light emitting diodes of four sub-pixel regions of every two adjacent rows and two adjacent columns constitute a pixel unit, and ones of the conductive structures are arranged at at least two corners of the pixel unit.

4. The display substrate of claim 2, wherein the conductive structures have a thickness of about 1 μm to 2 μm.

5. The display substrate of claim 4, further comprising: an adhesive layer between the planarization layer and the auxiliary electrode.

6. The display substrate of claim 5, wherein a surface of the adhesive layer on a side of the adhesive layer away from the base substrate is coplanar with surfaces of the plurality of conductive structures on a side of the plurality of conductive structures away from the base substrate.

7. The display substrate of claim 1, wherein the auxiliary electrode is a mesh-shaped auxiliary electrode made of a metal material, the mesh-shaped auxiliary electrode extends along the pixel defining layer, and an orthographic projection of the mesh-shaped auxiliary electrode on the plane where the pixel defining layer is located is within the area where the pixel defining layer is disposed; or, the auxiliary electrode is a plate-shaped electrode which is made of a transparent conductive material and laid in a whole layer.

8. The display substrate of claim 1, further comprising: a film encapsulation layer on a side of the auxiliary electrode away from the base substrate.

9. A display device, comprising the display substrate of claim 1.

10. A method of fabricating a display substrate, comprising:

forming, on a base substrate, a pixel defining layer and a plurality of sub-pixel regions defined by the pixel defining layer, and forming bottom electrodes and light emitting layers of a plurality of organic light emitting diodes in the plurality of sub-pixel regions;

providing a top electrode layer on the pixel defining layer and the light emitting layers of the plurality of organic light emitting diodes;

forming a plurality of conductive structures on at least a portion of the top electrode layer on the pixel defining layer at a side of the top electrode layer away from the base substrate, an orthographic projection of the plurality of conductive structures on a plane where the pixel defining layer being within an area where the pixel defining layer is disposed, and the plurality of conductive structures being coupled to the portion of the top electrode layer on the pixel defining layer;

forming a planarization layer on the remaining portion of the top electrode layer at a side of the top electrode layer away from the base substrate; and forming an auxiliary electrode on a side of the planarization layer away from the base substrate, the auxiliary electrode being coupled to the plurality of conductive structures so as to be electrically connected with the top electrode layer in parallel.

11. The method of claim 10, wherein the step of forming an auxiliary electrode on a side of the planarization layer away from the base substrate comprises:

forming the auxiliary electrode through a sputtering process; and transferring, through a transfer process, the auxiliary electrode to the side of the planarization layer away from the base substrate.

12. The method of claim 11, further comprising:

forming an adhesive layer between the planarization layer and the auxiliary electrode.

13. The method of claim 12 wherein the step of forming an adhesive layer between the planarization layer and the auxiliary electrode comprises:

after forming the planarization layer, forming, through a printing process, a curable adhesive material on the side of the planarization layer away from the base substrate; and after forming the auxiliary electrode, curing the adhesive material to form the adhesive layer.

14. The method of claim 13, wherein the step of forming a plurality of conductive structures on at least a portion of the top electrode layer on the pixel defining layer at a side of the top electrode layer away from the base substrate, comprises:

forming the plurality of conductive structures by a mask evaporation or mold hot pressing method.

15. The method of claim 14, wherein the plurality of sub-pixel regions are arranged in a plurality of rows and a plurality of columns, the organic light emitting diodes of every four adjacent sub-pixel regions in a row direction or a column direction constitute a pixel unit, and ones of the conductive structures are arranged at at least two corners of the pixel unit.

16. The method of claim 14, wherein the plurality of sub-pixel regions are arranged in a plurality of rows and a plurality of columns, the organic light emitting diodes of four sub-pixel regions of every two adjacent rows and two adjacent columns constitute a pixel unit, and ones of the conductive structures are arranged at at least two corners of the pixel unit.

17. The method of claim 15, wherein the conductive structures have a thickness of about 1 μm to 2 μm.

18. The method of claim 17, wherein the step of forming a planarization layer on the remaining portion of the top electrode layer at a side of the top electrode layer away from the base substrate comprises:

forming the planarization layer through a printing process.

19. The method of claim 18, wherein in the step of forming an auxiliary electrode on a side of the planarization layer away from the base substrate, the auxiliary electrode is formed to be a mesh-shaped auxiliary electrode made of a metal material, the mesh-shaped auxiliary electrode extends along the pixel defining layer, and an orthographic projection of the mesh-shaped auxiliary electrode on the plane where the pixel defining layer is located is within the area where the pixel defining layer is disposed; or, the auxiliary electrode is a plate-shaped electrode which is made of a transparent conductive material and laid in a whole layer.

20. The method of claim 11, further comprising:
    forming a film encapsulation layer on a side of the auxiliary electrode away from the base substrate.

* * * * *